United States Patent [19]
Wang et al.

[11] Patent Number: 5,068,869
[45] Date of Patent: Nov. 26, 1991

[54] SURFACE-EMITTING LASER DIODE

[75] Inventors: Shing C. Wang, Mountain View, Calif.; Mutsuo Ogura, Tsukuba, Japan; Shyh Wang, El Cerrito; Wei Hsin, Albany, both of Calif.

[73] Assignee: Lockheed Missiles & Space Company, Inc., Sunnyvale, Calif.

[21] Appl. No.: 206,386

[22] Filed: Jul. 14, 1988
(Under 37 CFR 1.47)

[30] Foreign Application Priority Data

Jun. 19, 1987 [JP] Japan .................... 62-154213

[51] Int. Cl.$^5$ ............................................ H01S 3/19
[52] U.S. Cl. .................................. 372/45; 372/46; 372/50; 372/92
[58] Field of Search .................. 372/45, 46, 50, 92, 372/108

[56] References Cited

U.S. PATENT DOCUMENTS

| 4,309,670 | 1/1982 | Burnham et al. | 372/46 |
| 4,873,696 | 10/1989 | Coldren et al. | 372/46 |
| 4,901,327 | 2/1990 | Bradley | 372/46 |

FOREIGN PATENT DOCUMENTS

| 59-36988 | 2/1984 | Japan . |
| 59-104188 | 6/1984 | Japan . |
| 61-4291 | 1/1986 | Japan . |
| 62-152192 | 7/1987 | Japan . |

OTHER PUBLICATIONS

Kenichi Iga et al., "Room Temperature Pulsed Oscillation of GaAlAs/GaAs Surface Emitting Junction Laser", *IEEE JQE*, vol. QE-21, No. 6, Jun. 1985, pp. 663-668.

*Primary Examiner*—James W. Davie
*Attorney, Agent, or Firm*—John J. Morrissey

[57] ABSTRACT

A surface-emitting semiconductor laser diode has a vertical multilayer active region and a lateral buried heterojunction. Effective carrier confinement to the active region is achieved, thereby permitting laser action at room temperature under continuous-wave operation with a low threshold current of about 2 mA.

12 Claims, 6 Drawing Sheets

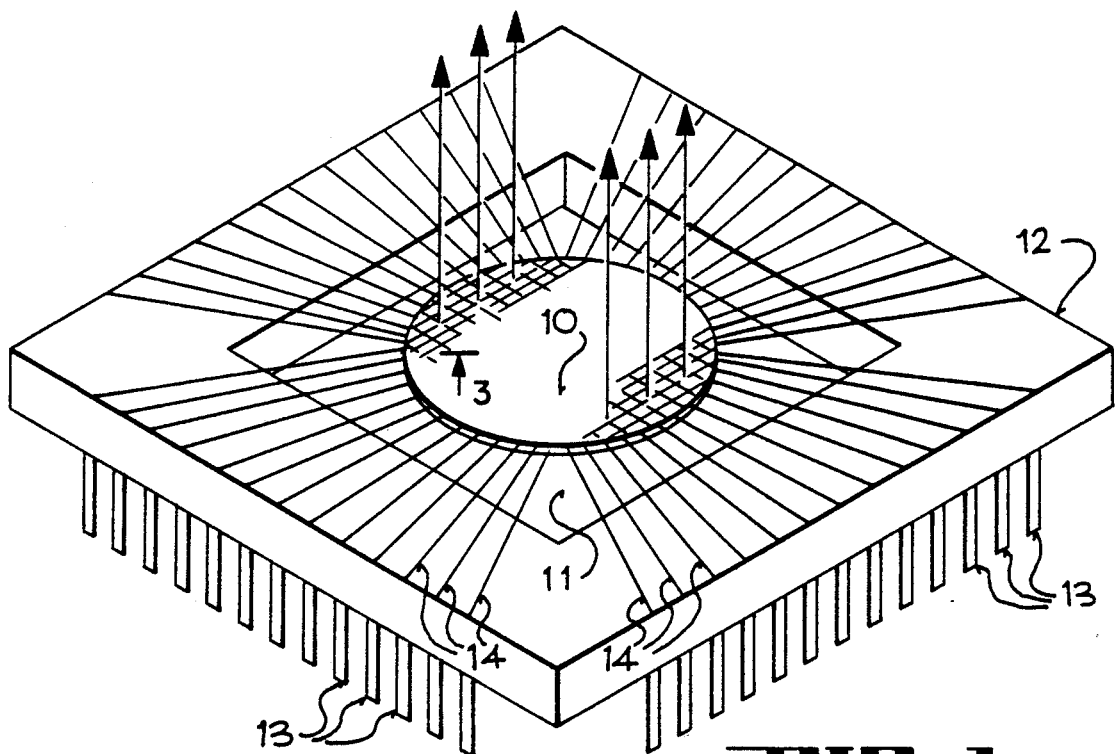
FIG_1
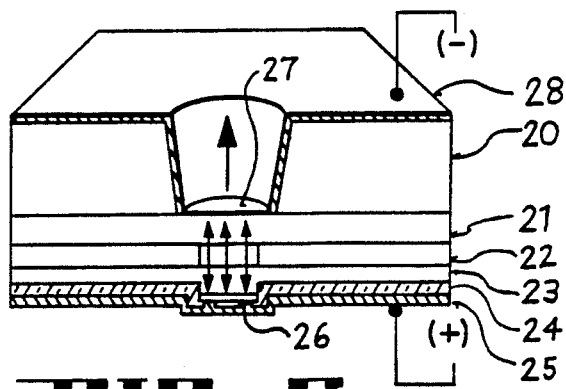
FIG_2
(PRIOR ART)
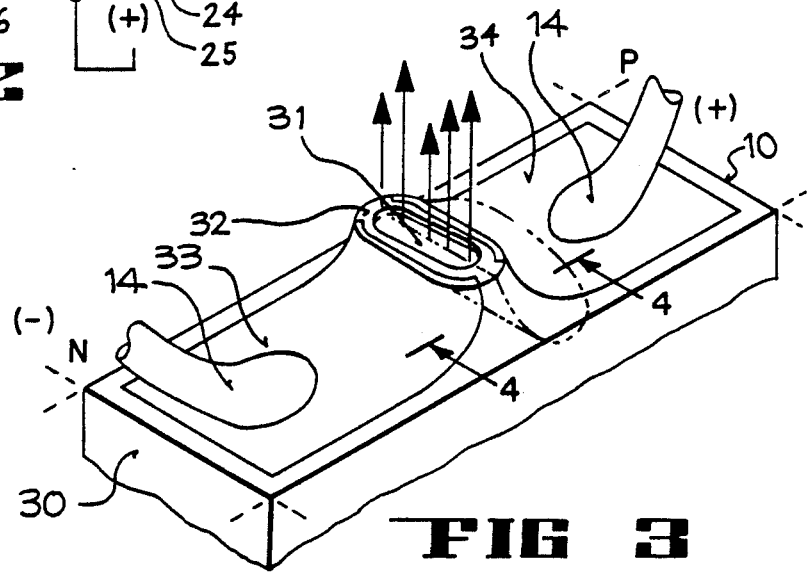
FIG 3

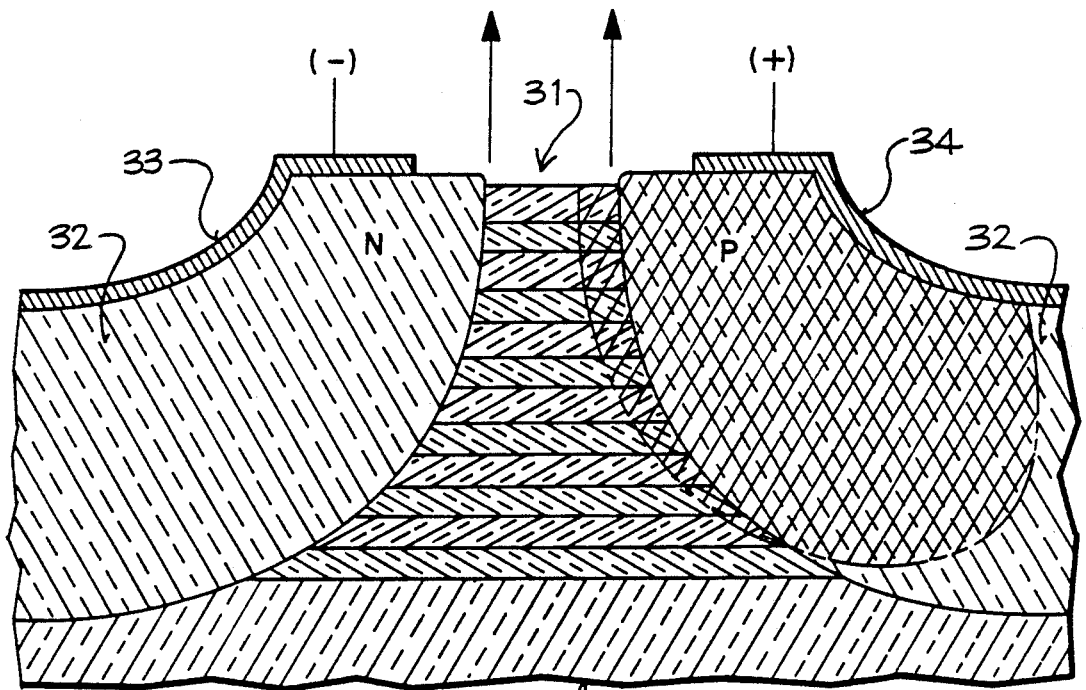
FIG_5
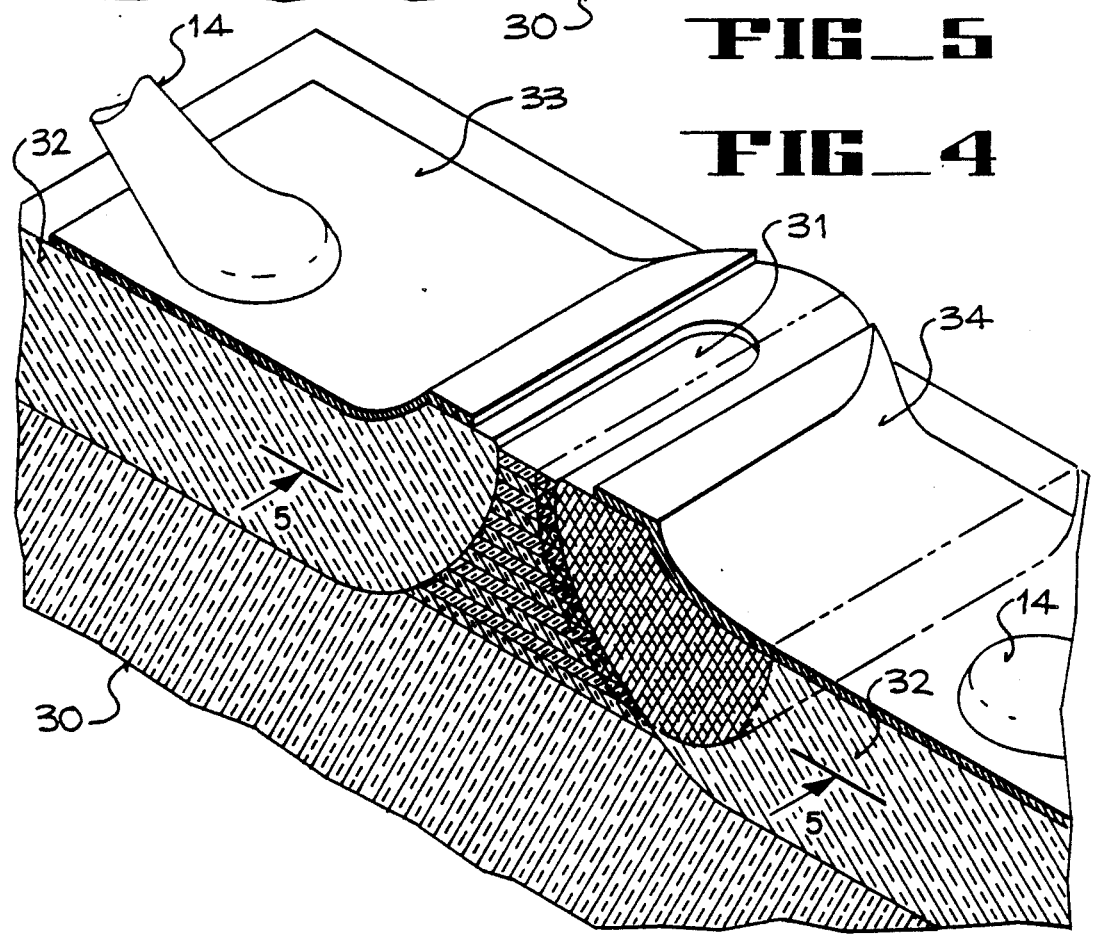
FIG_4

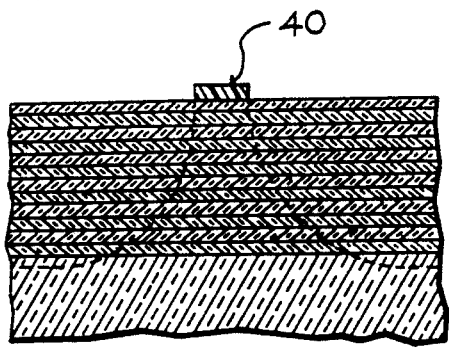
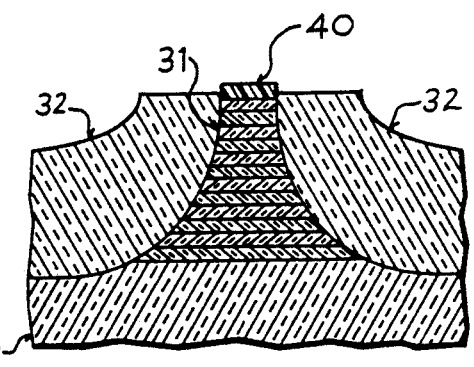
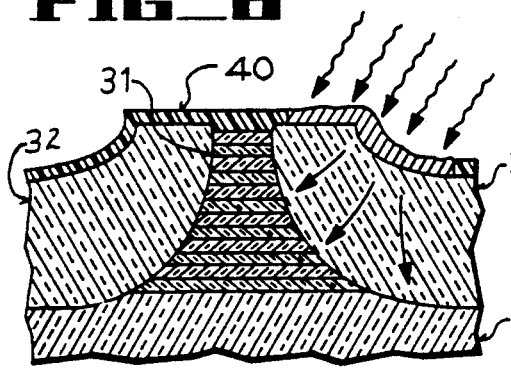
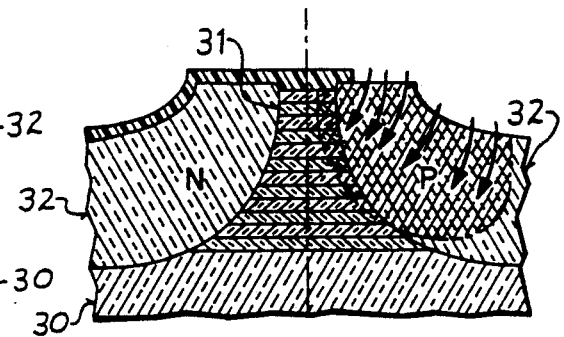
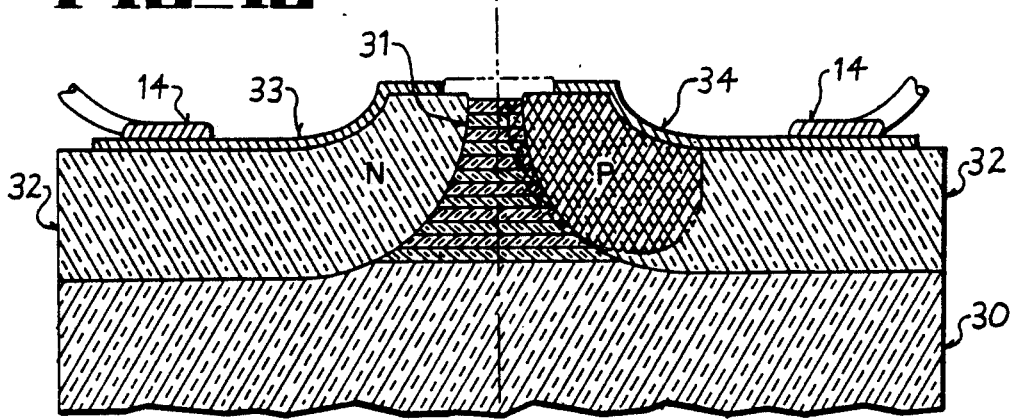

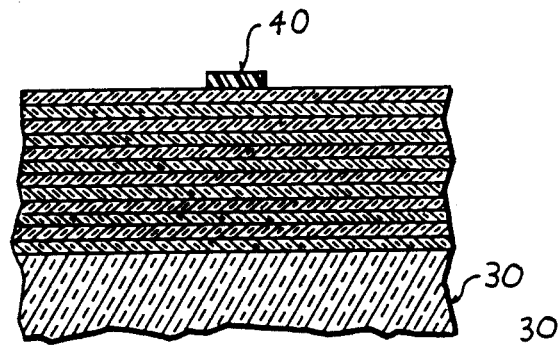
FIG_11
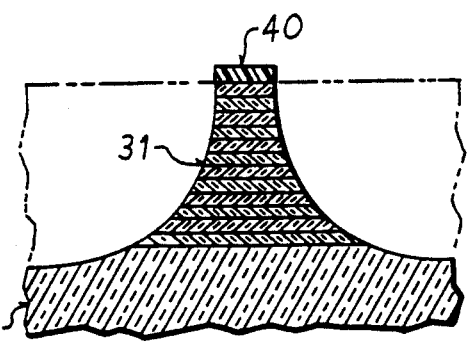
FIG_12
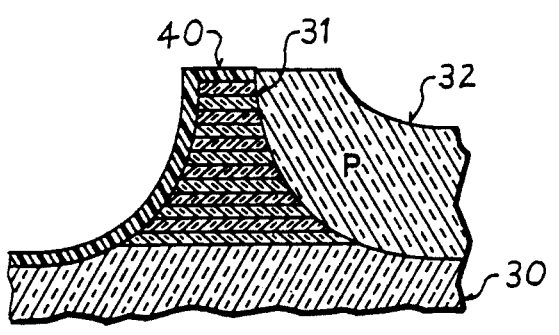
FIG_13
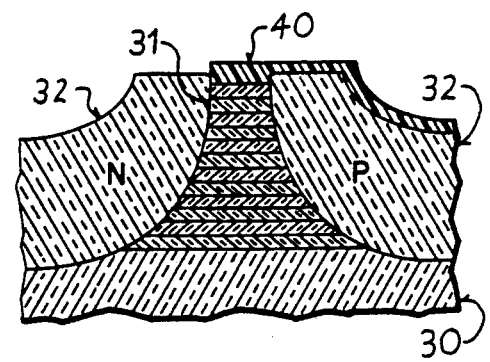
FIG_14
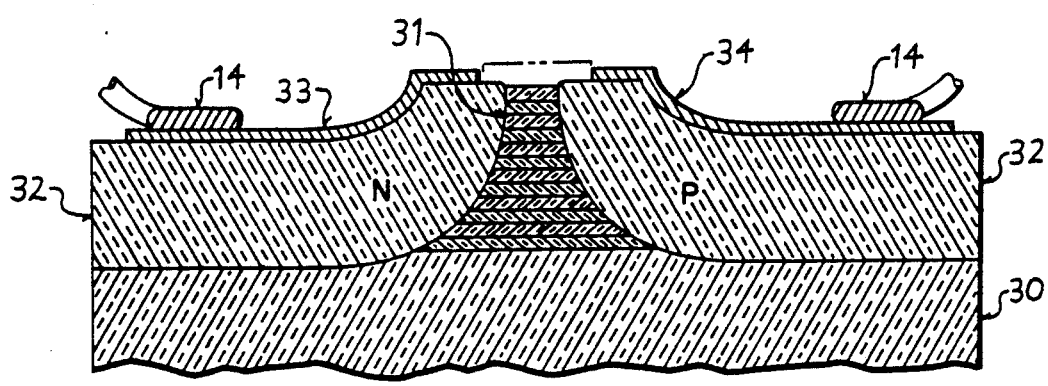
FIG_15

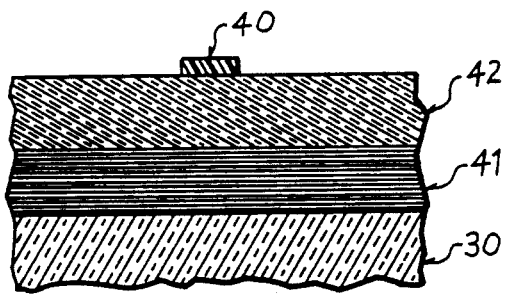
FIG_16
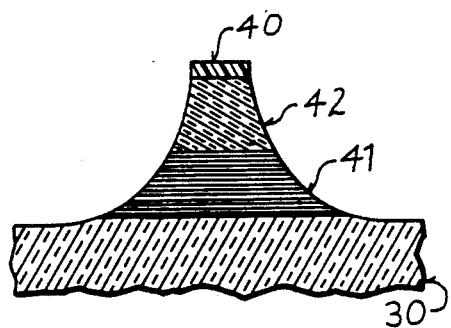
FIG_17
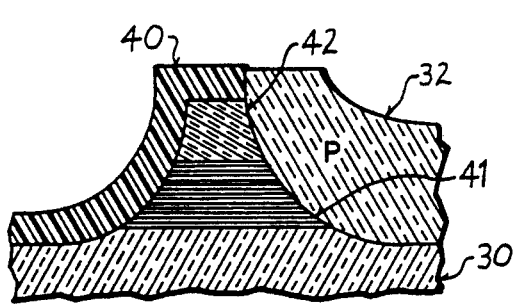
FIG_18
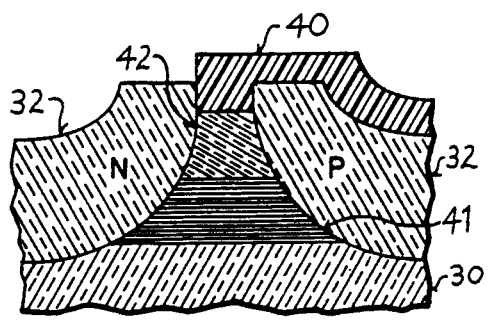
FIG_19
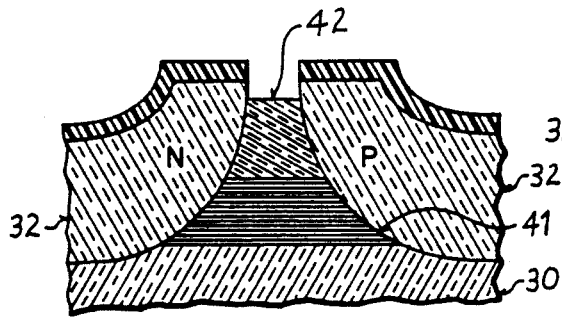
FIG_20
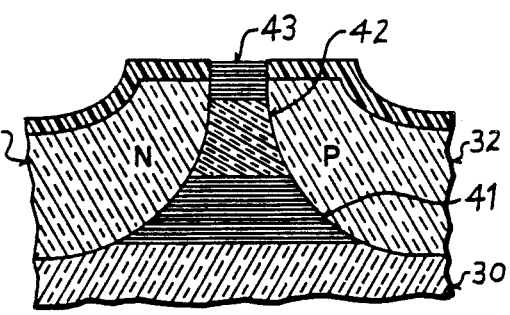
FIG_21

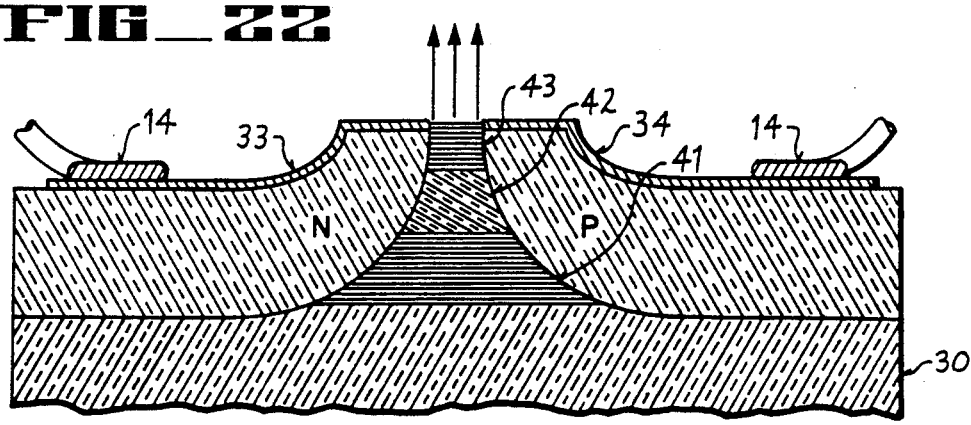
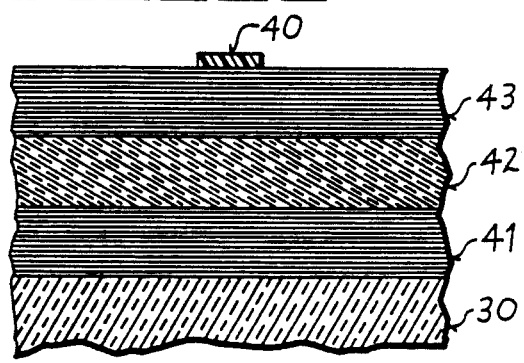
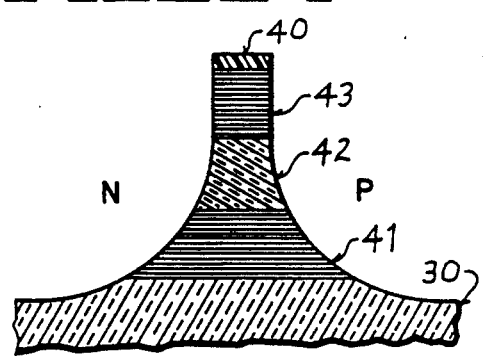

SURFACE-EMITTING LASER DIODE

TECHNICAL FIELD

This invention relates generally to surface-emitting semiconductor laser diodes, and more particularly to a surface-emitting semiconductor laser diode having a vertical multilayer active region and a lateral buried heterojunction.

BACKGROUND OF THE INVENTION

In a typical edge-emitting semiconductor laser diode, an active layer is formed parallel to a p-n junction in a semiconductor wafer, and two cleaved facets of the wafer perpendicular to the active layer function as mirror surfaces to form the laser resonator. To produce a laser beam perpendicular to the semiconductor wafer, special structures (such as 45-degree mirrors or diffraction gratings) must be formed on a surface of the wafer to re-direct the output of the laser resonator in the desired direction.

In a typical surface-emitting semiconductor laser diode, both surfaces of a semiconductor wafer function as mirror surfaces to form the laser resonator, whereby laser emission occurs in a direction perpendicular to a surface of the wafer. A surface-emitting semiconductor laser diode exemplifying the state of the prior art is described in an article entitled "Room Temperature Pulsed Oscillation of GaAlAs/GaAs Surface Emitting Junction Laser" by Kenichi Iga, et al. which was published in the *IEEE Journal of Quantum Electronics*, Vol. QE-21, No. 6, June 1985, pages 663–668. In general, the active region of a surface-emitting semiconductor laser diode of the prior art is formed parallel to a p-n junction in the semiconductor wafer. Consequently, in surface-emitting semiconductor laser diodes of the prior art, carrier current cannot be confined to the immediate vicinity of the active region, and a rather high threshold current is therefore required to initiate laser action.

SUMMARY OF THE INVENTION

It is an object of the present invention to provide a surface-emitting semiconductor laser diode in which injected carriers are well-confined to the immediate vicinity of the active region on a semiconductor wafer, and in which the laser beam is well-confined within an emission surface of the wafer. A surface-emitting laser diode in accordance with the present invention is characterized by a p-n heterojunction comprising vertical multilayer active region surrounded by a cladding structure. The heterojunction extends laterally with respect to the emission surface of the wafer (i.e., perpendicular to the direction of propagation of the laser beam), thereby forming a lateral buried heterojunction structure.

In operation, a surface-emitting laser diode according to the present invention can be energized with a continuous-wave current at a significantly lower threshold (i.e., on the order of 2 mA for room-temperature cw operation) than is required for a typical surface-emitting laser diode of the prior art. Typically, a surface-emitting laser diode of the prior art requires a threshold current on the order of 300 mA (pulsed) to initiate laser action.

A laser beam-generating device can be fabricated comprising a two-dimensional array of surface-emitting laser diodes according to the present invention. An array of surface-emitting laser diodes is inherently much smaller in size and has a higher surface-emitting density (i.e., "filling factors") than an array of edge-emitting laser diodes. Also, a laser beam-generating device comprising an array of surface-emitting laser diodes according to the present invention does not require etching procedures to form mirrors or diffraction gratings on a surface of a semiconductor wafer, as would be required to produce a laser-beam generating device comprising an array of edge-emitting laser diodes.

Structurally, a surface-emitting laser diode according to the present invention comprises a so-called "III–V" semiconductor substrate (e.g., a GaAs crystal) on which are formed an active region consisting of a vertical multilayer active region, and a cladding structure circumjacent the active region. The active region comprises a plurality of pairs of alternating layers in which each pair comprises a first layer made of a multinary compound consisting of at least three elements from Groups III and V of the Periodic Table (e.g., AlGaAs), and a second layer made of a material having a different energy band gap than the first layer (e.g., GaAs). The cladding structure has an n-type region and a p-type region on opposite sides of the vertical active region, thereby forming a lateral p-n heterojunction. A difference of electrical potential applied across the heterojunction causes current to flow transversely through the active region, which results in the emission of a laser beam from the active region in a direction perpendicular to the emitting surface of the substrate.

DESCRIPTION OF THE DRAWING

FIG. 1 is a perspective view of a semiconductor chip mounted on a chip carrier, with a two-dimensional array of surface-emitting laser diodes formed on the semiconductor chip.

FIG. 2 is a schematic cross-sectional perspective view of a surface-emitting semiconductor laser diode of the prior art.

FIG. 3 is a perspective view along a line through point 3 of FIG. 1 showing a surface-emitting semiconductor laser diode according to the present invention.

FIG. 4 is a cross-sectional perspective view along line 4—4 of FIG. 3 illustrating a distributed feedback (DFB) type of surface-emitting laser diode according to the present invention.

FIG. 5 is a cross-sectional view along line 5—5 of FIG. 4.

FIGS. 6–10 are cross-sectional schematic-detail views indicating major steps in a process for fabricating the DFB surface-emitting laser diode of FIG. 4.

FIG. 11–15 are cross-sectional schematic-detail views indicating major steps in an alternative process for fabricating the DFB surface-emitting laser diode of FIG. 4.

FIG. 16–22 are cross-sectional schematic-detail views indicating major steps in a process for fabricating a distributed Bragg reflector (DBR) type of surface-emitting laser diode according to the present invention.

FIG. 23–24 are cross-sectional schematic-detail views indicating major steps in an alternative process for fabricating the DBR surface-emitting laser diode of FIG. 22.

BEST MODE OF CARRYING OUT THE INVENTION

In FIG. 1, a gallium arsenide (GaAs) semiconductor "chip" or wafer 10 is shown on which a two-dimensional array of surface-emitting laser diodes according to the present invention is formed. The wafer 10 has a generally circular top surface, and the surface-emitting laser diodes are formed in a rectangular array thereon. A bottom surface of the wafer 10 is bonded in a conventional manner to a surface 11 within a depression formed on a front face of a chip carrier 12. Electrical connector pins 13 are shown extending generally perpendicularly from a rear face of the chip carrier 12, and electrical leads 14 are bonded in a conventional manner to the front face of the chip carrier 12 to connect each surface-emitting laser diode on the wafer 10 with a corresponding pair of the pins 13. Surface-emitting laser diodes on the wafer 10 can be energized simultaneously, or each surface-emitting laser diode can be individually energized.

In FIG. 2 illustrates a surface-emitting semiconductor laser diode generally of the type described in the above-cited article by Iga et al. The laser diode of FIG. 2 is formed on a gallium arsenide substrate 20. A vertical p-n heterojunction is produced by forming a layer 21 of n-type material (e.g., $Al_{0.4}Ga_{0.6}As$) on a surface of the substrate 20, by forming an active layer 22 of p-type GaAs on the layer 21, and by forming a layer 23 of p-type material (e.g., $Al_{0.4}Ga_{0.6}As$) on the layer 22. An electrically insulating layer 24 (e.g., $SiO_2$) is formed on the layer 23, and an aperture is provided in the insulating layer 24 in which a ring electrode 25 is positioned. The ring electrode 25 surrounds an optical reflector 26. A "window" hole is etched through the substrate 20, and a reflective surface 27 (e.g., a thin-film layer of gold) is formed on the exposed layer 21 of the p-n heterojunction at the bottom of the "window" hole in vertical alignment with the reflector 26. The reflective surfaces 26 and 27 form a laser resonator. An electrode 28 is formed on the opposite surface of the substrate 20 and on the side wall of the "window" hole through the substrate 20. A difference of potential applied between the electrodes 25 and 28 causes electrical current to flow through an active region thereby defined in the layer 22 of the p-n heterojunction, which results in the emission of a laser beam from the active region through the "window" hole in a direction perpendicular to the substrate 20.

A regrettable characteristic of a surface-emitting semiconductor laser diode of the type illustrated in FIG. 2 is that electrical current flow through the p-n heterojunction is not well-confined to the active region. Consequently, a higher threshold current is required to initiate laser action than would be necessary if the current could be confined to the active region.

FIG. 3 illustrates an individual surface-emitting laser diode of the array formed on the wafer 10 of FIG. 1. A portion of the wafer 10 serves as a substrate 30 on which an active region is formed. The active region 31 extends generally perpendicularly upward from a top surface of the substrate 30, and a cladding structure 32 is formed on the top surface of the substrate 30 around the active region 31. Metallic layers 33 and 34 are formed on surface portions of the cladding structure 32 on opposite sides of the active region 31 to function as negative and positive electrodes, respectively; and electrical leads 14 are bonded to the electrodes 33 and 34. When a difference of potential is applied between the electrodes 33 and 34, light is emitted from the active region 31 perpendicular to the surface of the substrate 30 as indicated by the arrows in FIG. 3.

The surface-emitting semiconductor laser diode shown in the perspective view of FIG. 3 could be, for example, of the distributed feedback (DFB) type or of the distributed Bragg reflector (DBR) type. The internal structure of a surface-emitting laser diode of the DFB type is illustrated in FIG. 4, which shows the vertical active region 31 as comprising a multilayer stack consisting of a plurality of pairs of alternating layers of aluminum gallium arsenide (AlGaAs) and gallium arsenide (GaAs) formed on the top surface of the substrate 30. In the particular example illustrated in FIG. 4, the substrate 30 is made of semi-insulating gallium arsenide (GaAs). However, in principle, the substrate 30 could be described more generally as being made of a binary compound consisting of elements from Groups III and V of the Periodic Table of Elements; and the vertical active region 31 could be described more generally as comprising a multilayer stack consisting of pairs of alternating first and second layers in which each first layer is made of a multinary compound consisting of at least three elements from Groups III and V of the Periodic Table and each second layer is made of a compound having the same consistency as the substrate 30. Thus, for example, the substrate 30 could also be made of indium phosphide (InP), in which case the vertical active region 31 comprises a multilayer stack consisting of alternating layers made of InGaAsP and InP.

In the example shown in FIG. 4, the first layer in the active region 31 consists of an aluminum gallium arsenide compound whose constituents are proportioned as $Al_{0.3}Ga_{0.7}As$ (which can be formed on the top surface of the GaAs substrate 30 by a conventional crystal growing technique such as molecular beam epitaxy, metalorganic chemical vapor deposition, or liquid-phase epitaxy); and the second layer in the active region 31 consists of GaAs (which can likewise be formed by a conventional crystal growing technique).

The cladding structure 32 of the particular example shown in FIG. 4 is made of a semiconductor material whose energy gap is wider than the energy gap of the compound of which the active layers (viz., GaAs) in the multilayer vertical active region 31 are made. Thus, the cladding structure 32 is made of an aluminum gallium arsenide compound whose constituents are proportioned as $Al_{0.4}Ga_{0.6}As$. In the alternative embodiment in which the substrate 30 is made of indium phosphide (InP) and the active layers of the active region 31 are made of InGaAsP, the cladding structure 32 is made of InP. The cladding structure 32 surrounds the vertical active region 31, thereby forming a buried heterojunction structure. When a difference of electrical potential is applied across the heterojunction, an electrical current passes through active layers of the active region 31 in a direction generally parallel to the top surface of the substrate 30 (i.e., perpendicular to the direction of propagation of light emitted from the active region 31). Each layer in the active region 31 has an optical thickness equal to one-quarter wavelength of the laser radiation to be emitted from the active region 31. In FIG. 5, arrows perpendicular to the top surface of the active region 31 indicate the direction of propagation of the laser beam produced in the active region 31.

FIGS. 6 to 10 illustrate major steps in a process for fabricating a DFB type of surface-emitting semiconductor laser diode according to the present invention. As shown in FIG. 6, successive layers of $Al_xGa_{1.0-x}As$ and GaAs are deposited in pairs one over the other on a GaAs substrate, where the value of x is selected to determine the desired energy band gap. The number of pairs of $Al_xGa_{1.0-x}As$ and GaAs layers depends upon the particular laser diode design; and in a typical design there would be about 80 pairs. A mask 40 is then placed over a portion of the uppermost layer (a GaAs layer). Portions of the $Al_xGa_{1-x}As$ and GaAs layers not vertically aligned with the mask 40 are then removed by a conventional etching technique, thereby leaving a mesa-like vertical stack of alternating layers of $Al_xGa_{1.0-x}As$ and GaAs, which form the active region 31. Preferably, the sides of the active region 31 would be perpendicular to the top surface of the substrate 30, but conventional wet etching processes typically produce curved sides for the active region 31 as indicated by the curved broken lines in FIG. 6. In practice, it is acceptable for the mesa-like active region 31 to have curved sides, rather than perfectly straight sides perpendicular to the substrate 30.

The next step, as illustrated in FIG. 7, is to form the cladding structure 32 circumjacent the mesa-like active region 31. The cladding structure 32 is formed by depositing a layer of n-type $Al_yGa_{1.0-y}As$, where y is greater than or equal to x, on the GaAs substrate 30 to a height slightly above the height of the mesa-like active region 31, thereby "filling in" the space from which portions of the $Al_xGa_{1.0-x}As$ and GaAs layers were removed by the etching process. Then, as illustrated in FIG. 8, a mask is formed over the cladding structure 32, and a "window" is opened (by a conventional photolithographic technique) in a portion of the mask overlying a region of the cladding structure 32 adjacent one side of the active region 31 (viz., the right-hand side of the active region 31 in FIG. 8). The region of the cladding structure 32 in the vicinity of the "window" is then converted from n-type to p-type by a conventional zinc diffusion process.

In FIG. 9, the p-type region of the cladding structure is indicated by a curved broken line. (A portion of the zinc also diffuses into the active region 31). After completion of the zinc diffusion process, a p-n heterojunction is formed transversely across the action region 31. As shown in FIG. 10, the masking structure is then removed; and the electrodes 33 and 34 are formed by a conventional technique on the n-region and the p-region, respectively, of the cladding structure 32 on opposite sides of the active region 31. Electrical leads 14 are then secured to the electrodes 33 and 34 to form the DFB surface-emitting laser diode.

An alternative technique for fabricating a DFB surface-emitting laser diode according to the present invention without using a zinc diffusion process involves steps as illustrated in FIGS. 11-15. In FIG. 11, successive layers of aluminum gallium arsenide and gallium arsenide are shown deposited in pairs on a gallium arsenide substrate as described above with respect to FIG. 6. Then, portions of the AlGaAs and GaAs layers are etched away to form the mesa-like active region 31 as illustrated in FIG. 12. Then, a two-step regrowth process (e.g., liquid-phase epitaxy) is used, first to form a p-type region in the cladding structure 32 on one side of the active region 31, and then to form an n-type region in the cladding structure 32 on the other side of the active region 31. Thus, FIG. 13 shows the p-type cladding region being formed, and FIG. 14 shows the n-type cladding region being formed. After the p-type and n-type regions of the cladding structure 32 are formed, the electrode layers 33 and 34 are then formed as shown in FIG. 15.

FIGS. 16-21 schematically illustrate key steps in a process for fabricating a distributed Bragg reflector (DBR) type of surface-emitting semiconductor laser diode according to the present invention. As shown in FIG. 16, successive layers of AlGaAs and GaAs are formed on the gallium arsenide substrate 30 to form a stack 41 of reflectors. Each reflector layer in the stack 41 has an optical thickness equal to one-quarter wavelength of the desired laser beam. Then, an active region 42 of GaAs is formed to a thickness of 3 to 5 microns (depending upon the particular laser diode design) on the top reflector layer. In FIGS. 17-19, an etching process and a two-step regrowth process are indicated (as described above with respect to FIGS. 12-14) in which a p-type region is formed on one side and an n-type region is formed on the other side of the cladding structure 32 surrounding the mesa-like structure comprising the stack 41 of reflectors and the active region 42. (Alternatively, the p-n heterojunction could be formed by a zinc diffusion process as described above with respect to FIGS. 8-9.) As shown in FIG. 20, the cladding structure 32 is then masked, and the active region 42 is exposed. Then, as shown in FIG. 21, a multilayer dielectric coating 43 is formed over the active region 42 to serve as an optical reflector. The completed DBR surface-emitting laser diode is illustrated in FIG. 22.

An alternative method for fabricating a DBR surface-emitting laser diode involves starting with a structure as shown in FIG. 23 in which successive layers of AlGaAs and GaAs are formed on the gallium arsenide substrate 30 to serve as a stack 41 of reflectors; whereupon the relatively thick (3 to 5 microns) active GaAs region 42 is formed over the stack 41, and the multilayer dielectric coating 43 is then formed over the active region 42. Then, portions of the structures 41, 42 and 43 on the substrate 30 are etched away, leaving the vertical mesa-like structure, as shown in FIG. 24. Then, the cladding structure 32 is formed around the mesa-like structure (by, e.g., a zinc diffusion process or a regrowth process as described above) to produce the lateral buried heterojunction.

The present invention has been described above in terms of particular embodiments fabricated using particular materials. However, other embodiments that could be fabricated using other materials would become apparent to practitioners skilled in the art upon perusal of the foregoing specification and the accompanying drawing. Therefore, the specification and drawing presented herein are to be understood as illustrative of the invention, which is more generally defined by the following claims and their equivalents.

We claim:

1. A surface-emitting laser diode comprising:
   a) a semiconductor substrate made of a binary compound substantially consisting of a first element from Group III and a second element from Group V of the Periodic Table of Elements;
   b) an active region formed on a surface of said substrate, said active region being generally vertical with respect to said surface of said substrate, said active region consisting of a plurality of pairs of first and second layers formed consecutively one upon the other, each first layer being made of a multinary compound substantially consisting of at least three elements all of said elements of said multinary compound being from Groups III and V of the Periodic Table of Elements, at least one of said elements of said multinary compound being from Group III and at least another one of said elements of said multinary compound being from Group V, each second layer substantially consisting of said binary compound of which said substrate is made, said active region thereby functioning as a resonant cavity;

c) a cladding structure formed on said substrate circumjacent said active region, said cladding structure consisting of a semiconductor material having a wider energy gap than said multinary compound of which said first layers of said active region are made, said cladding structure having a p-type region and an n-type region, said p-type and n-type regions being separated from each other within said cladding structure, said p-type and n-type regions being in contact with said active region to form a lateral buried heterojunction with said active region, said cladding structure thereby functioning to inject an electrical current so as to generate said laser beam and to confine said laser beam within said active region for emission in a direction substantially perpendicular to said surface of said substrate;

d) a first electrode formed on said p-type region of said cladding structure; and e) a second electrode formed on said n-type region of said cladding structure.

2. The laser diode of claim 1 wherein said semiconductor substrate is made of gallium arsenide.

3. The laser diode of claim 2 wherein said first layers of said active region are made of an aluminum gallium arsenide compound.

4. The laser diode of claim 3 wherein said second layers of said active region are made of gallium arsenide.

5. The laser diode of claim 3 wherein said cladding structure is made of an aluminum gallium arsenide compound having a wider energy gap than said first layers of said active region.

6. The laser diode of claim 4 wherein said first layers of said active region are made of $Al_{0.3}Ga_{0.7}As$, and wherein said cladding structure is made of $Al_{0.4}Ga_{0.6}As$.

7. The laser diode of claim 1 wherein said semiconductor substrate is made of indium phosphide.

8. The laser diode of claim 7 wherein said first layers of said active region are made of an InGaAsP compound.

9. The laser diode of claim 8 wherein said second layers of said active region are made of indium phosphide.

10. The laser diode of claim 8 wherein said cladding structure is made of an InP compound having a wider energy gap said first layers of said active region.

11. The laser diode of claim 9 wherein said first layers of said active region are made of an InGaAsP compound, and wherein said cladding structure is made of indium phosphide.

12. A laser beam-generating device comprising an array of surface-emitting laser diodes formed on a semiconductor substrate, said substrate being made of a binary compound substantially consisting of a first element from Group III and a second element from Group V of the Periodic Time of Elements; ;each of said surface-emitting laser diodes of said array comprising an active region formed on a surface of said substrate, said active region being generally vertical with respect to said surface of said substrate, said active region consisting of a plurality of pairs of first and second layers formed consecutively one upon the other, each first layer being made of a multinary compound substantially consisting of at least three elements, all of said elements of said multinary compound being from Groups III and V of the Periodic Table of Elements, at least one of said elements of said multinary compound being from Group III and at least another one of said elements of said multinary compound being from Group V, each second layer substantially consisting of said binary compound of which said substrate is made, said active region functioning as a resonant cavity; a cladding structure being formed on said substrate circumjacent said active region of each of said surface-emitting laser diodes of said array, said cladding structure consisting of a semiconductor material having a wider energy gap than said multinary compound of which said first layers of said active region are made, said cladding structure having a p-type region and an n-type region, said p-type and n-type regions being separated from each other within said cladding structure, said p-type and n-type regions being in contact with said active region to form a lateral buried heterojunction with said active region said cladding structure functioning to inject an electrical current so as to generate said laser beam and to confine said laser beam within said active region for emission in a direction substantially perpendicular to said surface of said substrate; a first electrode being formed on said p-type region and a second electrode being formed on said n-type region of said cladding structure circumjacent said active region of each of said surface-emitting laser diodes of said array.

* * * * *